United States Patent [19]

Sullivan

[11] Patent Number: 4,645,733
[45] Date of Patent: Feb. 24, 1987

[54] HIGH RESOLUTION PRINTED CIRCUITS FORMED IN PHOTOPOLYMER PATTERN INDENTATIONS OVERLAYING PRINTED WIRING BOARD SUBSTRATES

[76] Inventor: Donald F. Sullivan, 115 Cambridge Rd., King of Prussia, Pa. 19406

[21] Appl. No.: 720,354

[22] Filed: Apr. 5, 1985

Related U.S. Application Data

[63] Continuation-in-part of Ser. No. 681,686, Dec. 14, 1984, which is a continuation-in-part of Ser. No. 550,379, Nov. 10, 1983, Pat. No. 4,528,259.

[51] Int. Cl.⁴ .............................................. G03C 5/00
[52] U.S. Cl. .................................... 430/314; 430/315; 430/318; 430/319
[58] Field of Search ............... 430/314, 315, 318, 319

[56] References Cited

U.S. PATENT DOCUMENTS

| | | | |
|---|---|---|---|
| 2,585,700 | 2/1952 | Strickman . | |
| 3,605,260 | 9/1971 | Spridco et al. | 430/312 |
| 3,791,858 | 2/1974 | McPherson et al. | 117/201 |
| 4,307,179 | 12/1981 | Chang et al. | 430/314 |
| 4,374,457 | 2/1983 | Wiech, Jr. | 29/591 |
| 4,521,449 | 6/1985 | Arnold et al. | 427/96 |
| 4,532,152 | 7/1985 | Elarde | 427/96 |

Primary Examiner—John E. Kittle
Assistant Examiner—Patrick J. Ryan
Attorney, Agent, or Firm—Laurence R. Brown

[57] ABSTRACT

High resolution, high packing density printed circuit wiring with high conductivity wiring is achieved by putting down thick (0.006 in., 0.015 cm) liquid photopolymer insulator layers on an inexpensive substrate and photodeveloping conductor pattern indentations in the layer for filling with conductive materials. Thus, 0.003 in. (0.008 cm) line to line spacings can be achieved with high conductivity conductors 0.006 in. (0.015 cm) thick. A flush top layer of polymer is readily cleaned of contaminants by light surface sanding to assure designed insulation spacings of polymer between conductors without interfering smears. The finished circuits are not subject to damage in handling from surface scratches since the conductors are indented.

9 Claims, 6 Drawing Figures

HIGH RESOLUTION PRINTED CIRCUITS FORMED IN PHOTOPOLYMER PATTERN INDENTATIONS OVERLAYING PRINTED WIRING BOARD SUBSTRATES

This is a continuation-in-part of my copending application Ser. No. 681,686 filed Dec. 14, 1984 for High Density Printed Wiring, which in turn is a continuation-in-part of my copending application Ser. No. 550,379 filed Nov. 10, 1983, now U.S. Pat. No. 4,528,259 for Printed Wiring Boards With Solder Mask Over Bare Copper Wires Having Large Area Thickened Circuit Pad Connections.

TECHNICAL FIELD

This invention relates to printed circuits and more particularly it relates to high density, high conductivity, high reliability printed wiring over substrates with surface irregularities.

BACKGROUND ART

Many problems of conductivity and reliability are posed in circuit patterns which are more dense and more closely packed together. For example, low resolution screen printing and etching methods provide edge smears which tend to short together adajcent wires, thus limiting spacing between conductors to more than about 0.01 inch (0.025 cm). Also, the conventional methods of plating or depositing printed wires, which usually are thinner than 0.001 inch (0.003 cm), results in very low conductivity wiring when the conductor widths are less than about 0.006 inch (0.015 cm).

Even more restrictive in practical low cost systems is the nature of the substrates. Conventional substrates have significant surface irregularities from their fibrous construction, and thus the surface irregularities significantly increase the chance for defects in high density printed wiring patterns directly placed thereupon.

Attempts have been made to photographically reproduce high resolution printed wiring patterns as shown by U.S. Pat. No. 2,585,700 to S. W. Strickman of Feb. 12, 1952, wherein photographically processed gelatin layer patterns are processed as a mold to receive conductors which are threafter, when the gelatin is removed, cast into a resin which serves as a substrate. Not only is this a tedious and costly process but the conductors are very thin and thus very low in conductivity.

A general object of this invention therefore is to correct the general deficiencies of the prior art.

It is therefore a more specific objective of this invention to produce printed circuits in an inexpensive process using performed printed wiring board substrates of a conventional nature to obtain reliable and precise circuits which may be densely packed and yet have high conductivity.

DISCLOSURE OF THE INVENTION

In my above-mentioned parent applications, I describe a process for achieving high density printed wiring by photographically forming deeply (0.006 in., 0.015 cm) indented channels in a photopolymer layer on a suitable substrate, electrochemically depositing a thin layer of conductive material on the photopolymer surface and removing conductive material from the outer polymer surface by sanding, thereby to assure photopolymer insulation of specified distance between adjacent conductors.

In accordance with this invention, the deep channels are filled with conductive material to provide greater conductivity, thereby removing the significant low conductivity disadvantage of densely packed wiring spaced by as little as 0.003 in. (0.008 cm) center to center, thus significantly improving conventional printed wiring separations of at least three times that.

The simplified process thus simply comprises covering a printed wiring substrate with a layer, typically 0.006 in. (0.015 cm) thick, of liquid paste consistency photopolymer, photographically producing a wiring pattern in surface, filling the channels with a conductive mixture and hardening it, and sanding the surface to assure that the conductors in the channels are always spaced by the insulation of the intervening thickness of polymer provided in the wiring pattern.

Preferably the liquid polymer layer is photodeveloped by a flat glass plate in contact therewith to produce a flat flush surface, which is readily sanded to remove surface contaminants, such as smeared conductor left when a conductive paste is squeezed into the indentations. The sanding could not occur with thin coatings because of the irregularities of inexpensive fabric base printed wiring board substrates.

The conductors are preferably of a suitable conductive polymer ink, but may also be of a resistive material to form resistive circuit components, if desired. Multilayer circuits of the additive type are readily formed by this process since the finished product may be used as a substrate for a further layer.

THE PREFERRED EMBODIMENTS

Figure 1:
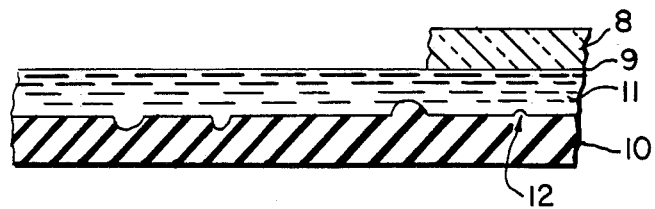
FIG. 1 shows in fragmental cross section a printed wiring board assembly comprising a substrate with a superimposed liquid photopolymer layer used to photodevelop a pattern of circuit indentations.

As may be seen from FIG. 1, an inexpensive non-precision substrate 10, such as a fiberglass laminate with an irregular surface pattern represented by weave irregularities, etc. 12, may be used to attain precision wiring patterns. A layer of paste consistency liquid photopolymer 11 is superimposed on the substrate, preferably of a thickness of about 0.006 in. (0.015 cm). This layer is photodeveloped by contact printing of a phototool pattern 9 to produce high resolution printed wiring patterns. The glass plate 8 is important in achieving a flat top surface, irrespective of the surface irregularities 12, which after photo curing produces a glossy surface to which contaminants do not as readily cling as with a matte surface.

Figure 2:
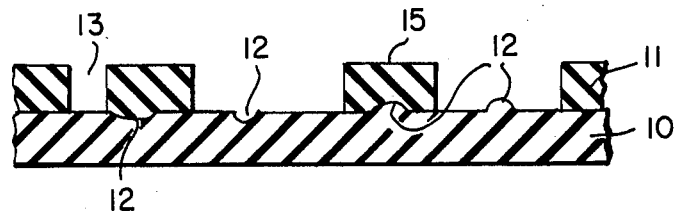
FIG. 2 shows in fragmental cross section the assembly following photodevelopment of a desired circuit pattern leaving selected indentations in the polymer layer.
Figure 3:
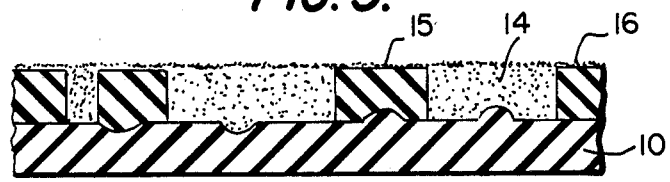
FIG. 3 shows in fragmental cross section the assembly further processed to fill the indentations with conductive material.
Figure 4:
FIG. 4 shows in fragmental cross section the assembly after a sanding step to remove surface contaminants.

Thus, after a photodevelopment step the pattern of FIG. 2 is achieved, where uncured photopolymer is washed out leaving indentations 13 between polymer insulation in a pattern defining the indentations as the desired wiring pattern. The outer surface 15 is flat and glossy so that a squeegee can ride thereupon and deposit a conductive material 14 such as conductive polymer ink into the indentations as seen in FIG. 3. There is a thin residue layer 16 formed on the resulting flat outer surface, which is sanded off as represented in FIG. 4 to produce known distances of the polymer insulation layer 11 between adjacent conductors without smears that could cause short circuiting.

The flat top is important, since the sanding step therefore removes only a thin layer of contamination, which of itself does not readily adhere to the glossy surface of the polymer if made with the glass 8 phototool. Other equivalent mechanical removal steps may, of course, be used.

The conductors present much higher conductivity than thin plated conductors, and this is an unexpected synergistic feature when conductors are placed closer together with higher packing density yet exhibit higher conductivity. On conventional flat surface plated circuit boards, the more dense the circuits the lower the conductivity because of the reduced area for putting down the conductor. These conductors also offer the significant advantage of higher integrity in handling the finished printed wiring board product. The conventional conductor is deposited on the surface and extends perhaps 0.001 in. (0.003 cm) above the surface of the substrate. Thus, when handled, it is easily scratched or damaged. These indented conductors avoid that problem.

Figure 6:
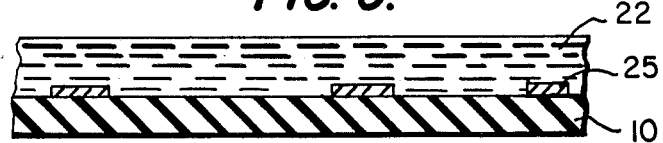
FIG. 6 is a variation of FIG. 5 wherein a further circuit layer is added to a conventional circuit board.

In FIG. 6, the advantage of the invention of working with surface irregularities is illustrated. Thus, a conventional wiring pattern 25 upon substrate 10 has conductors extending from the surface. The paste consistency of the liquid polymer layer 22 covers these conductors in air bubble free contact. Then by the hereinbefore decribed process a second printed circuit layer can be added, for example, to connect a resistive material between selected conductors 25 on the substrate.

It is thus to be recognized that this invention has provided an improved process which provides significantly thicker conductors of above 0.002 in. (0.005 cm) to about 0.006 in. (0.015 cm), and thus lower conductivity while permitting the packing density to be improved by closer together, narrower conductors which nevertheless unexpectedly do not suffer from low conductivity.

The basic process steps comprise forming a patterned polymer layer over an inexpensive substrate probably having surface irregularities with a substantially flat outer surface defining an indentation pattern for receiving conductors, filling the indentations with a paste consistency conductive material to form a conductor pattern, hardening in place and machining off any residual contaminants on the outer surface to assure designed polymer insulating distances between adjacent conductors.

In my parent application Ser. No. 550,379 the process is described for photopatterning insulation layer 11 using a liquid photopolymer to produce deep conductor channels extending below a flat top surface which is molded to conform to the surface characteristics of a glass plate phototool.

After unexposed photopolymer is washed out in a solvent the channels are filled with a conductive polymer ink applied with a doctor blade and then hardened thereby forming electrical conductors. Residual conductive material remaining on the flat top surface is removed by sanding. It should be noted that the surface irregularities 12 on the surface of insulation base 10 have no effect on the formation of high integrity conductors, for the thickness of photopolymer patterns 11 are of the order of 0.006 inches thick and this thickness overcomes the effects of surface irregularities which are inherent in printed wiring laminates. For example, unclad fiberglass laminate has a surface topology which reproduces the pattern or weave in the fiberglass cloth reinforcement, and the effects of the weave pattern is completely overcome by this instant disclosure.

There are several types of conductive polymer inks which are commercially available which can be used with the disclosed process. Specific materials and processes are included in the following examples.

EXAMPLE #1

A silver filled liquid conductive polymer ink is available from the ACME Chemicals and Insulation Company, as product E-KOTE 3030. Printed circuits are made using this product by coating an insulation substrate with a layer of liquid photopolymer in paste-like consistency of the order of 0.003 inches thick; one suitable method is to use a coarse mesh screen printing fabric without a stencil. A glass plate phototool is also similarly coated and the two layers are joined in face to face contact in an air free union. A suitable photopolymer is available from M & T Chemicals, Inc. as product CNF 1075. While so cojoined a UV light source which need not be collimated hardens light struck photopolymer and adheres it firmly to the substrate. Next, the phototool is separated from the substrate and unpolymerized photopolymer is washed out in a mild solvent such as a semi-aqueous mixture of butyl cellosolve and water. It should be noted that the ability to achieve thick photopatterns, of the order of 0.006 inches having spacings of the order of 0.003 inches, can be attributed to the emulsion to emulsion contact of the phototool and the liquid paste consistency photopolymer, and this exceptional resolution with extremely thick coating allows the flat top surface to be mechanically sanded to remove excess photopolymer without damaging or otherwise disturbing the conductor traces contained within the indented channels.

EXAMPLE #2

Whereas the conductive polymer ink of Example 1 is dried thermally there is a photopolymer made by W. R. Grace Co., product F-1782, which is hardened by exposure to UV light. While formulated to be applied in the desired pattern by screen printing, the resolution of this material can be greatly improved when used in this instant process. Thus, after channel formation as described in Example 1, the conductive silver paste is applied by doctor blade then cured by exposure to a strong UV light source, for example using a 200 watts per inch lamp with the substrate conveyed thereunder at a speed of 5 feet per minute. The process steps hereinbefore described are followed to complete the printed wiring.

EXAMPLE #3

The disclosed process surprisingly affords an improved method for forming multi-layer printed wiring boards. After the formation of deep channel printed wiring as described in Example 1, a layer of insulation can be photopatterned in a thick pinhole free layer following the process of Example 1, using a phototransparency containing opaque areas where interconnections are to be made between adjacent layers. See FIG. 5. Onto this insulation layer another pattern of deep channels are formed and these channels and interconnection holes are then filled with conductive polymer ink and dried, etc. Thus, the process permits underlying irregularities, that is, the interconnection holes to be accommodated so that each layer is of a uniform controlled thickness, enabling many layers to be built up with no loss of electrical integrity. Current art dry film photopolymers cannot produce such uniform layers, for the dry film is of a predetermined thickness and cannot be easily formed into a flat top surface irrespective of the underlying topology.

Figure 5:
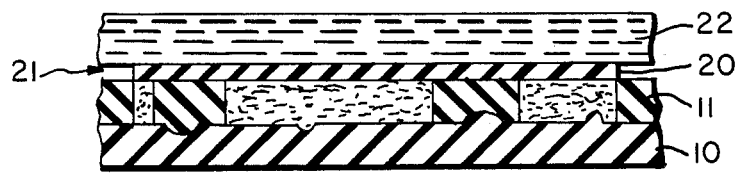
FIG. 5 shows in fragmental cross section the assembly used as a substrate for additively constructing a multiple layer circuit board by repeated processing of a further liquid photopolymer layer superimposed on the assembly.

Reference is made to FIG. 5, wherein the basic bottom two layers are similar to FIG. 4. Superimposed thereon is thin insulation layer 20 with gaps or voids 21 at circuit positions where connections are to be made. Then the liquid polymer layer 21 is superimposed and flows into gaps 21 also (although not so shown to illustrate the layer interconnection method). Then an appropriate wiring or resistor circuit pattern proceeds as before by the photodevelopment, filling, curing and sanding steps.

EXAMPLE #4

In a similar process, the deeply indented channels can be filled with a resistor paste material available from many suppliers, then dried and excess resistor material removed from the flush outer surface by sanding, so as to produce resistive electrical components whose ohmic resistance is more accurate than achievable with current art screen printing processes. When the resistor pastes are applied by screen printing in the current art, the resistor ohmic value is determined by the cross section area and length, and insofar as the low resolution obtainable by screenprinting has a pronounced effect on conductor width, the achievable accuracy is limited. Resistors reduced by this instant disclosure uses these same resistor pastes to produce much more accurate components, while achieving increased packing density.

Having therefore improved the state of the art, those novel features believed descriptive of the nature and spirit of this invention are defined with particularity in the following claims.

I claim:

1. The process of producing high resolution closely spaced printed circuits on a substrate which may have surface irregularities, comprising the steps of:
    forming a patterned polymer layer over said substrate having a substantially flat outer surface with conductor receiving indentations therein to a depth of at least 0.002 in. (0.005 cm),
    filling the indentations flush with the substantially flat outer surface with a conductive material defining circuit patterns on the substrate, and
    machining the substantially flat outer surface to remove a thin layer thereby to remove any spillover conductive material on the flat surface of the polymer layer to confine the conductive material within said indentations with the insulating polymer separating adjacent conductive areas.

2. The process defined in claim 1 wherein the conductive material is a metal filled conductive polymer.

3. The process defined in claim 1 wherein the conductive material forms a wiring pattern of conductors on the substrate.

4. The process defined in claim 1 wherein the substrate upon which said polymer layer is formed has a printed wiring pattern upon its surface contributing to surface irregularities, further comprising the step of:
    producing a multiple layer circuit board wherein the conductive material in said pattern forms other circuit components.

5. The process defined in claim 1 wherein the substantially flat outer surface is formed by depositing the polymer layer on the substrate as a photopolymer and photographically forming the pattern by means of a flat glass plate carrying an image thereon in contact with the surface while photocuring, thereby to produce therein by means of a flat glass plate photo image a glossy outer surface.

6. The product made by the process of claim 1.

7. The process of making printed circuits comprising the steps of making a photopolymer pattern overlying the surface of a printed wiring board substrate to define therein circuit pattern indentations substantially thicker than 0.001 in. (0.003 cm), and filling said indentations with conductive materials to form a wiring pattern.

8. The process of claim 7 further comprising the step of mechanically removing contaminants on the polymer exposed surface to assure a predetermined spacing of polymer between adjacent conductors.

9. The product made by the process of claim 7.

* * * * *